United States Patent
Hogari et al.

(10) Patent No.: US 7,492,126 B2
(45) Date of Patent: Feb. 17, 2009

(54) SECONDARY CELL RESIDUAL CAPACITY CALCULATION METHOD AND BATTERY PACK

(75) Inventors: Masaki Hogari, Fukushima (JP); Yoshinori Ohta, Fukushima (JP); Atsushi Nakanouchi, Fukushima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/897,591

(22) Filed: Jul. 23, 2004

(65) Prior Publication Data

US 2005/0024020 A1 Feb. 3, 2005

(30) Foreign Application Priority Data

Jul. 29, 2003 (JP) .......................... P2003-281470

(51) Int. Cl.
*H02J 7/00* (2006.01)
(52) U.S. Cl. .................... 320/132; 320/134; 324/431
(58) Field of Classification Search .............. 320/132, 320/134; 324/431, 433, 434
See application file for complete search history.

(56) References Cited

U.S. PATENT DOCUMENTS

| | | | | |
|---|---|---|---|---|
| 4,947,123 | A * | 8/1990 | Minezawa | 324/427 |
| 5,789,899 | A * | 8/1998 | van Phuoc et al. | 320/112 |
| 5,955,869 | A * | 9/1999 | Rathmann | 320/132 |
| 6,294,894 | B1 * | 9/2001 | Ochiai et al. | 320/132 |
| 6,310,462 | B1 * | 10/2001 | Arai et al. | 320/132 |
| 6,930,465 | B2 * | 8/2005 | Kishi et al. | 320/132 |
| 2003/0057918 | A1 | 3/2003 | Aoki et al. | |
| 2004/0100267 | A1 * | 5/2004 | Koch | 324/427 |

FOREIGN PATENT DOCUMENTS

| | | |
|---|---|---|
| EP | 1 251 360 A1 | 10/2002 |
| FR | 2 754 395 | 4/1998 |
| JP | 08-140270 | 5/1996 |
| JP | 2001-051030 | 2/2001 |
| JP | 2001-281306 | 10/2001 |
| JP | 2002056903 | 2/2002 |
| JP | 2002-189066 | 7/2002 |

OTHER PUBLICATIONS

Japanese Office Action dated Feb. 20, 2007 (2 pages).
European Office Action dated Sep. 10, 2006 (4 pages).

* cited by examiner

*Primary Examiner*—Akm Enayet Ullah
*Assistant Examiner*—Aaron Piggush
(74) *Attorney, Agent, or Firm*—Bell, Boyd & Lloyd LLP (57) ABSTRACT

A secondary cell residual capacity calculation method and a battery pack capable of calculating the secondary cell residual capacity is provided. The calculation method includes detecting a temperature of a plurality of secondary cells; detecting a current and a terminal voltage of the plurality of secondary cells; digitizing temperature, current, and terminal voltage; calculating a cell polarization voltage from the digitized temperature, current and terminal voltage; calculating an original cell voltage from both of the calculated cell polarization voltage and the detected terminal voltage; and calculating a residual capacity rate based on the calculated original cell voltage with reference to a prearranged residual capacity reference data table.

12 Claims, 6 Drawing Sheets

SECONDARY CELL RESIDUAL CAPACITY CALCULATION METHOD AND BATTERY PACK

CROSS REFERENCES TO RELATED APPLICATIONS

This application claims priority to Japanese Patent Application No. P2003-281470 filed on Jul. 29, 2003, the disclosure of which is incorporated by reference herein.

BACKGROUND OF THE INVENTION

The present invention relates to a secondary cell residual capacity calculation method and a battery pack. More specifically, the present invention relates to a residual capacity calculation method in a battery pack incorporating a microcomputer, and the battery pack.

At present, there is provided an electronic apparatus incorporating a secondary cell such as a lithium ion secondary cell, for instance, as a portable electronic apparatus power source. In the electronic apparatus incorporating the lithium ion secondary cell, a full charge is detected to prevent an overcharge state of the lithium ion secondary cell, and a final discharge voltage is detected from a terminal voltage of the lithium ion secondary cell to prevent an over-discharge state, likewise. For instance, the electronic apparatus is arranged to provide control so as to bring a system to a stop when the final discharge voltage is detected.

As charge-and-discharge control of the electronic apparatus as described above, there is provided, for instance, a residual capacity calculation method (which will be hereinafter referred to as a voltage method) utilizing the terminal voltage of the lithium ion secondary cell.

Specifically, there is provided a technology of expressing a terminal voltage-to-residual capacity relation of a charging-type cell at the discharging time, of calculating, with reference to a map, a capacity (zero capacity) that allows discharging to be stopped, and of correcting a cumulative residual capacity using the above zero capacity to make a correction of effects of a cumulative error due to a current integration, a capacity change with load current of the charging-type cell and a capacity change with deterioration, and the like thereby permitting a residual capacity to be detected with high accuracy, also permitting an error in the zero capacity to be minimized by using a three-dimensional map created with a relation additionally including a discharge current, and further permitting a detection accuracy of the residual capacity to be further increased by using a four-dimensional map further including a deterioration characteristic. See Japanese Patent Application Publication No. 2001-281306.

However, the terminal voltage of the secondary cell largely undergoes fluctuations with parameter such as current flowing to a connected load, temperature, deterioration, and the like, so that more accurate control using the voltage method needs to provide, as a table, for instance, a reference value for each parameter.

An arrangement of the table for each of all the parameters requires numerous tables, which lead to a waste of a ROM (Read Only Memory) incorporated in a microcomputer, resulting in a problem of being difficult to increase the number of tables randomly.

Further, data contained in the tables are calculated from results having been evaluated using practical parameters, so that a high accuracy is maintainable under a supposed environment, whereas a problem of being liable to cause an unexpected large error only by a slight deviation from the practical parameters arises.

Furthermore, decreasing the number of tables may reduce a storage capacity, but leads to a reduction in number of parameters specified as references, so that a value specified as an inter-table (inter-condition) value requires a computational expression for interpolation of the parameters. The interpolation in the presence of a need to perform inter-parameter interpolation involves a problem of being extremely difficult to suppress an error caused by the interpolation performed in consideration of parameter interactions.

A current integration method generally available as the residual capacity calculation method in the lithium ion secondary cell is of a system adaptable to meet a lithium ion secondary cell characteristic in which a charging electricity quantity Q and a discharging electricity quantity Q are both equal. This method enables a residual capacity calculation with high accuracy in an initial stage of the secondary cell after fabrication thereof.

However, effects of a measurement error, a self-discharge in a long-term preservation condition and a cell deterioration etc. lead to a need for cancellation of a cumulative electricity quantity error, that is, learning, with the lapse of a long time since the fabrication or with the repetition of charging and discharging over several hundred times. At this time, while the terminal voltage is measured as correct reference data required to allow the learning to be performed, the learning in the case of the lithium ion secondary cell takes place generally in a last discharge stage that is subject to a large discharge voltage change.

However, great fluctuations of values between a component having been obtained by a calculation using the current integration until now and a component obtained by an error cancellation in such a manner as to perform the learning using a result of voltage measurement occur frequently. Particularly, in the case of cells, such as a cell adapted to a camera for business use, in which an accuracy of the calculation on a residual discharge time in the last discharge stage is considered to be the most important point, an execution of the learning at the last discharge stage involves a problem of being incapable of highly accurate calculation on the residual discharge time in the last discharge stage, as a matter of course.

Further, when the highly accurate calculation on the residual capacity is required over a long period of time, the learning should be performed without incurring any erroneous learning. However, it is very difficult to allow the erroneous learning to be prevented, when learning data is set on the basis of a voltage. This may be attributed to the fact that the terminal voltage of the lithium ion secondary cell undergoes voltage fluctuations with temperature, and also causes large voltage fluctuations by a deterioration condition and by abrupt load fluctuations and the like. It is impossible to allow the microcomputer to obtain these parameters securely.

SUMMARY OF THE INVENTION

The present invention relates to a secondary cell residual capacity calculation method and a battery pack. More specifically, the present invention relates to a residual capacity calculation method in a battery pack incorporating a microcomputer, and the battery pack.

In an embodiment, the present invention provides a secondary cell residual capacity calculation method, which is aimed at minimizing a capacity of a table to be stored in a memory incorporated in a microcomputer so that a continuous natural residual capacity is calculated at all times so as to be free from an error caused at the time of interpolation and from calculated value stepping yielded at the time of transition of a reference table, and also a battery pack.

According to one embodiment, the present invention provides a secondary cell residual capacity calculation method, which is of detecting a temperature of a plurality of secondary cells, of detecting a current and a terminal voltage of each of the plurality of secondary cells, of digitizing the temperature, the current and the terminal voltage, of calculating a cell polarization voltage from the digitized temperature, current and terminal voltage, of calculating an original cell voltage from both of the calculated cell polarization voltage and the detected terminal voltage and of calculating a residual capacity rate on the basis of the calculated original cell voltage with reference to a prearranged residual capacity reference data table.

According to another embodiment, the present invention provides a battery pack, which comprises a plurality of secondary cells, a cell temperature detection means of detecting a temperature of the plurality of secondary cells, a voltage current detection means of detecting a current and a terminal voltage of each of the plurality of secondary cells, and a control means of digitizing the temperature, the current and the terminal voltage, of calculating a cell polarization voltage from the digitized temperature, current and terminal voltage, of calculating an original cell voltage from both of the calculated cell polarization voltage and the detected terminal voltage and of calculating a residual capacity rate on the basis of the calculated original cell voltage with reference to a prearranged residual capacity reference data table.

With the cell temperature detection means, the voltage current detection means and the control means that are provided as described above, the cell temperature, the current and the terminal voltage are digitized (into numeric values or coefficients) to permit the residual capacity rate to be calculated only with reference to the prearranged residual capacity reference data table.

According to the present invention, temperatures, loads and deterioration characteristics, and the like are all expressed in terms of the coefficients, numeric values, digitized and the like to permit a single computational expression to be adapted to meet the calculations, so that a need for charge and discharge evaluations for numerous tables is eliminated at the time of expansion to other types of apparatuses.

According to the present invention in an embodiment, uniting of a plurality of conventionally existing cell voltage-to-residual capacity rate tables into a single table permits a capacity thereof to be minimized, so that an effective utilization of a storage capacity in the microcomputer is attainable.

Further, according to the present invention in an embodiment, even if a coefficient of certain characteristic is in error, a reevaluation and a resetting of only the erroneous coefficient are merely required to ensure that a rechecking is easily executable.

According to the present invention in an embodiment, residual capacity calculation bases are all calculated in a ratio (a percentage value) based on a relative value, and an absolute value such as a residual capacity value is recalculated on the basis of a once calculated relative residual capacity rate or the like, so that there is no fear of accumulation of absolute value (residual capacity value) errors at all. While a current integration method needs to be sure to correct the absolute value when the measurement error and the cell deterioration lead to a disagreement between a full charging capacity and a measured cumulative capacity, the present invention eliminates the need for the correction thereof.

According to the present invention in an embodiment, it is not necessary to impose the correction on the calculated residual capacity, so that any stepping resulting from the presence or not of the correction is eliminated to ensure that a natural continuous characteristic result is obtainable at all times.

According to the present invention in an embodiment, breaking of a main electronic apparatus body is performed on the basis of a final discharge voltage, so that a system of calculating the residual capacity by using the similar voltage method easily provides matching with the electronic apparatus body.

According to the present invention in an embodiment, a final discharge prediction point is provided, so that even if an IR drop voltage (the cell polarization voltage) IRV value is deviated, the correction on a deviated value may be performed naturally as the final discharge voltage is being approached.

According to the present invention in an embodiment, a discharge rate integration performed using a relative residual capacity rate obtained at the discharging time permits charging and discharging cycles to be counted correctly even if a charging in the course of discharging and a shelf condition etc. are involved. With the use of the relative charging rate for the calculations, there are provided features to allow a higher cumulative discharge rate to be counted in proportion to a condition susceptible to the deterioration, such as a high-loaded condition, so that an original secondary cell deterioration is easily detectable.

According to the present invention in an embodiment, an effect on an internal resistance of the secondary cell and a full charge capacity (a discharge capacity) are managed separately as to the secondary cell deterioration, which may be thus set individually so as to be matched to the characteristic.

According to the present invention in an embodiment, matching to the original secondary cell deterioration characteristic is provided, so that the residual capacity accuracy is also obtainable in such a manner as to follow correctly a temperature change and a load fluctuation etc. even under a deteriorated condition.

An application of the residual capacity calculation method of the present invention to the battery pack incorporating the microcomputer enables the continuous natural residual capacity calculated value to be obtained at all times without leading to a waste of the storage capacity of the microcomputer nor being affected by changes with situation such as environmental condition and deterioration.

Additional features and advantages of the present invention are described in, and will be apparent from, the following Detailed Description of the Invention and the figures.

DETAILED DESCRIPTION OF THE INVENTION

The present invention relates to a secondary cell residual capacity calculation method and a battery pack. More specifically, the present invention relates to a residual capacity calculation method in a battery pack incorporating a microcomputer, and the battery pack.

Figure 1:
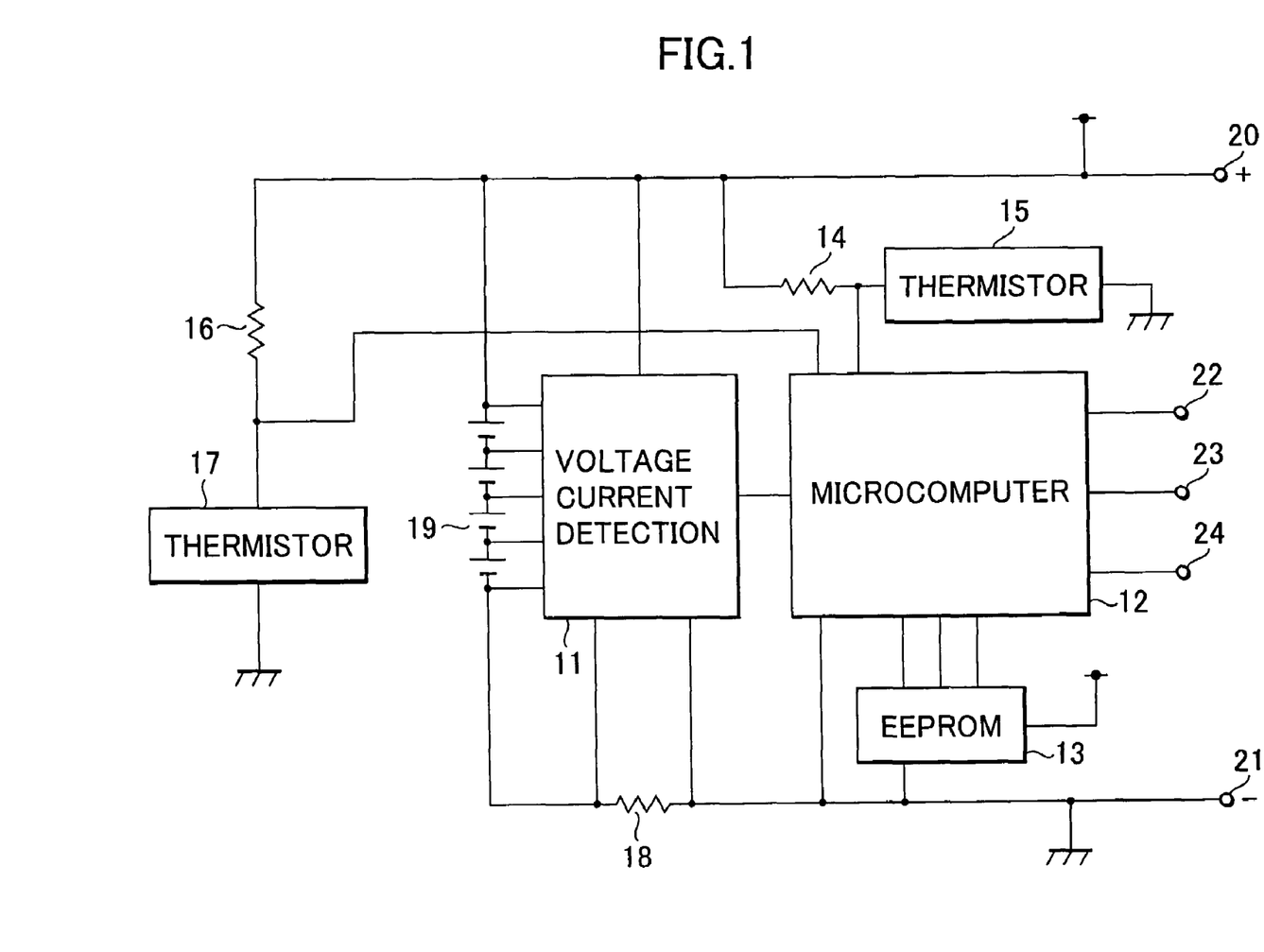
FIG. 1 is a block diagram for illustration on one embodiment of a battery pack obtained with the present invention applied pursuant to an embodiment.

An embodiment of the present invention is described hereinafter with reference to the accompanying drawings. FIG. 1 shows the whole configuration of an embodiment of a battery pack obtained with the present invention applied. A positive electrode side of a secondary cell group 19 composed of a plurality of secondary cells connected in series is connected to a positive terminal 20, and a negative electrode side thereof is connected to a negative terminal 21 through a resistance 18. Specifically, the positive terminal 20 is connected to a reference voltage, and the negative terminal 21 is grounded. Each of the plurality of secondary cells that form the secondary cell group 19 is a lithium ion secondary cell, for instance. The resistance 18 is a current detecting resistance.

A resistance 14 and a thermistor 15 connected in series and a resistance 16 and a thermistor 17 connected in series are interposed between the positive terminal 20 and a grounding. A point of connection between the resistance 14 and the thermistor 15 and a point of connection between the resistance 16 and the thermistor 17 are connected to a microcomputer 12.

Communication terminals 22, 23 and 24 adapted for communication with the outside are outgoing from the microcomputer 12 connected to the negative terminal 21. The microcomputer 12 is connected to an EEPROM (Electrically Erasable and Programmable Read Only Memory) 13. The EEPROM 13 is connected to the reference voltage and the negative terminal 21.

A voltage current detection circuit 11 connected to the positive terminal 20 is connected to the positive and negative electrode sides of the plurality of secondary cells that form the secondary cell group 19, and are further connected to the opposite ends of the resistance 18. The voltage current detection circuit 11 is also connected to the microcomputer 12.

Specifically, for the use of the lithium ion secondary cell, a protection circuit is sure to be provided. However, the protection circuit has no direct relation to the present invention, and therefore, is omitted from the configuration of FIG. 1.

The voltage current detection circuit 11 incorporates a voltage amplifier that is capable of detection of the terminal voltage of each of the plurality of secondary cells and an amplifier that detects a current by amplification of a voltage drop caused by the resistance 18. Further, the terminal voltage of the secondary cell selected by the microcomputer 12 may be supplied, as an analog signal, from the voltage current detection circuit 11 to the microcomputer 12. Likewise, a current detected by the voltage current detection circuit 11 is also supplied, as an analog signal, to the microcomputer 12.

In the microcomputer 12, the terminal voltage and the current supplied from the voltage current detection circuit 11 are digitized (into numeric values) using an A/D conversion function incorporated in the microcomputer. In the microcomputer 12, a resistance value of the thermistor 15 changes due to a change in temperature, so that an analog voltage obtained by means of resistance voltage dividing to a reference resistance is supplied. The voltage from the thermistor 15 is digitized using the A/D conversion function incorporated in the microcomputer 12 to permit a substrate temperature to be detected.

Likewise, in the microcomputer 12, a resistance value of the thermistor 17 changes due to the change in temperature, so that an analog voltage obtained by means of resistance voltage dividing to the reference resistance is supplied. The voltage from the thermistor 17 is digitized using the A/D conversion function incorporated in the microcomputer 12 to permit a cell temperature of the secondary cell group 19 to be detected. When a difference between the detected substrate temperature and the detected cell temperature exceeds a prescribed value, the microcomputer judges one of the thermistors 15 and 17 to be in a broken condition and then may bring the battery pack control to a stop.

Further, a program is stored in the microcomputer 12 so as to perform prescribed control, and an arithmetic processing is performed on the basis of supplied data. The microcomputer also incorporates a residual capacity reference data table storing part, so that a residual capacity is calculated with reference to the incorporated table.

Data such as a deterioration coefficient and a cycle count that are desired to be held even if the secondary cell group 19 enters an over-discharge state is stored in the EEPROM 13.

Figure 2A:
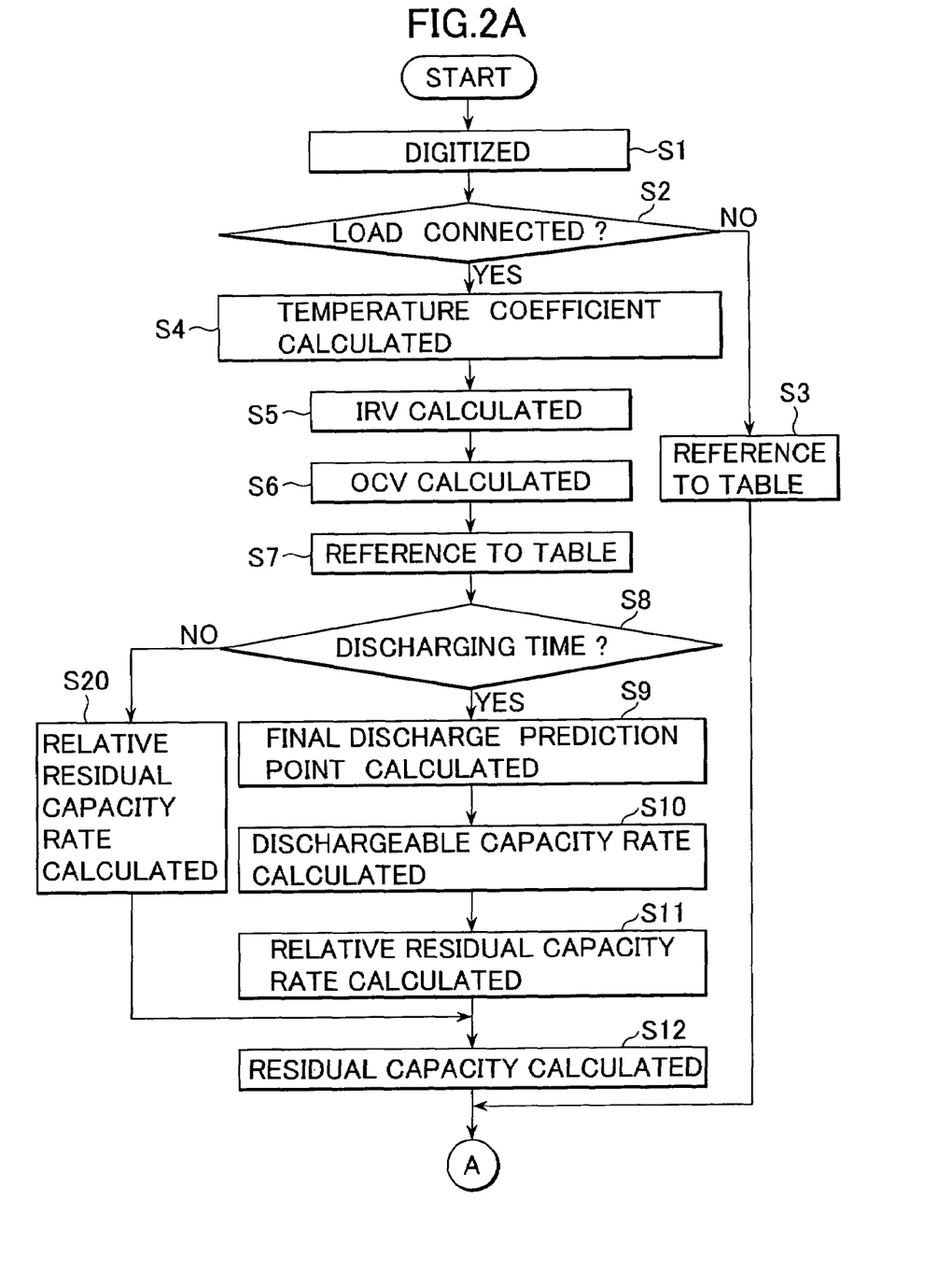
FIG. 2A and FIG. 2B are flowcharts for illustration on control of the present invention pursuant to an embodiment.
Figure 2B:
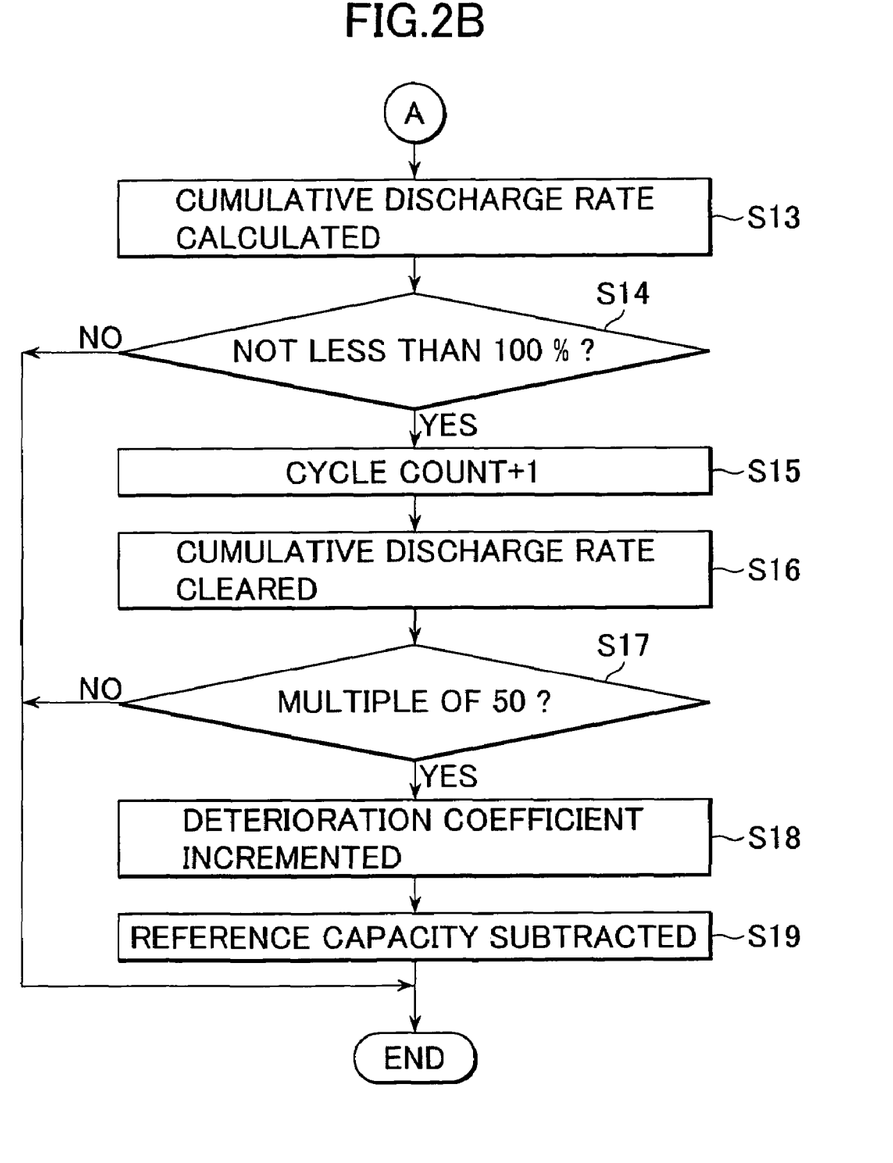

Control of the above embodiment is now described with reference to flowcharts of FIGS. 2A and 2B. In Step S1, the terminal voltage and the current from the voltage current detection circuit 11, the substrate temperature from the thermistor 15 and the cell temperature from the thermistor 17 are digitized using the A/D conversion function incorporated in the microcomputer.

In Step S2, it is judged from the digitized current whether or not a load is connected to the battery pack. When it is judged that the load is connected, the control moves on to Step S4. Conversely, when it is judged that the load is not connected, in other words, no-load is applied, the control moves on to Step S3. When the charging is being performed at the time of judgment, it is also judged that the load is connected, and the control moves on to Step S4. Specifically, when, provided that a threshold value is preset, an inputted current value is not more than the threshold value, it is judged that a no-load condition is being held. Conversely, when the inputted current value exceeds the threshold value, whether charging or discharging is being performed is judged by judging a current direction by a current sign.

Figure 3:
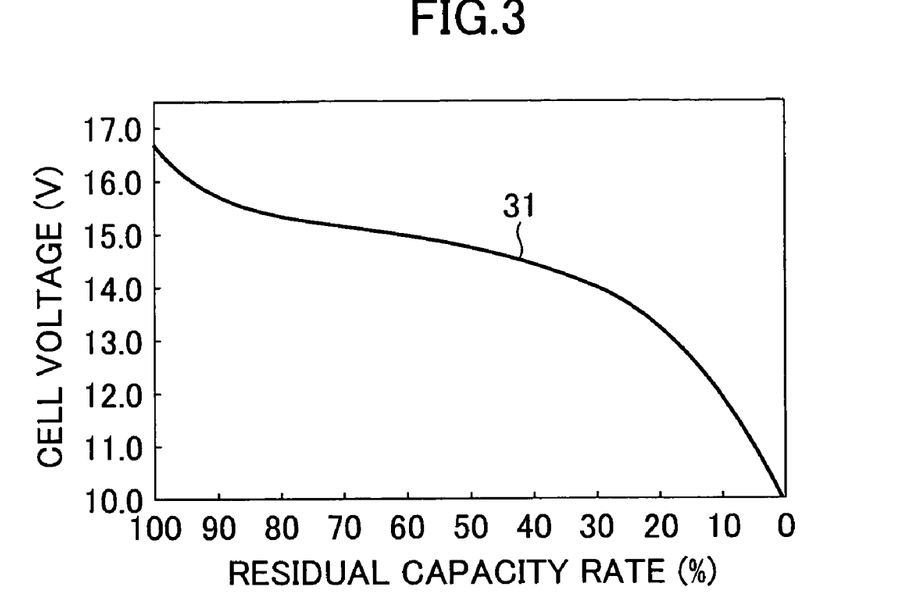
FIG. 3 is a characteristic diagram for illustration on a no-loaded condition of the battery pack obtained with the present invention applied pursuant to an embodiment.
Figure 4:
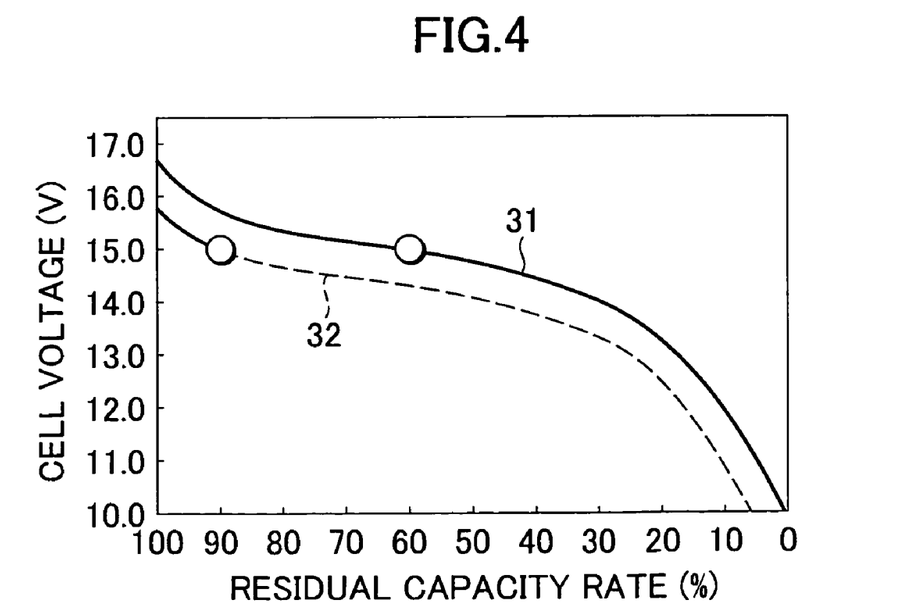
FIG. 4 is a characteristic diagram for illustration on a discharge condition (a load connection condition) of the battery pack obtained with the present invention applied pursuant to an embodiment.

In Step S3, a residual capacity rate is obtained with reference to a no-loaded time discharge curve 31 as shown in a cell voltage-to-residual capacity rate table of FIG. 3. The cell voltage-to-residual capacity rate table is placed in advance in the residual capacity reference data table storing part incorporated in the microcomputer. In the case of the no-loaded condition as described above, a cell voltage-to-residual capacity rate relation is provided in a stable condition, so that the residual capacity rate may be calculated directly from the detected terminal voltage with reference to the cell voltage-to-residual capacity rate table shown in FIG. 3. Then, the control moves on to Step S13.

On the other hand, for a cell voltage at a time when a load current or a charging current is flowing, a quite different residual capacity is indicated. Thus, an accurate value is not obtainable from a value of the terminal voltage as it is supplied from the voltage current detection circuit 11, even if reference to the no-loaded time discharge curve 31 shown in the cell voltage-to-residual capacity rate table of FIG. 3 is made. Practically, a discharging time discharge curve 32 (at the time when the load is connected) is provided in a condition where it is shifted downwards from the no-loaded time discharge curve 31. In the case of a cell voltage of 15V, for instance, a residual capacity of approximately 90% is obtained if the discharging is being performed, while a residual capacity obtained at the time of application of no-load is of approximately 60%.

A voltage drop caused by the internal resistance of the secondary cell is given as a reason why the reference to the residual capacity rate fails to be made on the basis of the cell voltage detected at the time when the load is connected. The lithium ion secondary cell is higher in internal resistance than other secondary cells such as nickel cadmium (NiCd) secondary cells and nickel hydrogen (NiMH) secondary cells. Thus, a high voltage drop (which will be hereinafter referred to as a cell polarization voltage IRV) arises at the time when the load is connected or at the charging time. An effect of great fluctuations of the cell polarization voltage IRV with environmental temperature and deterioration condition etc. is also involved.

Figure 5:
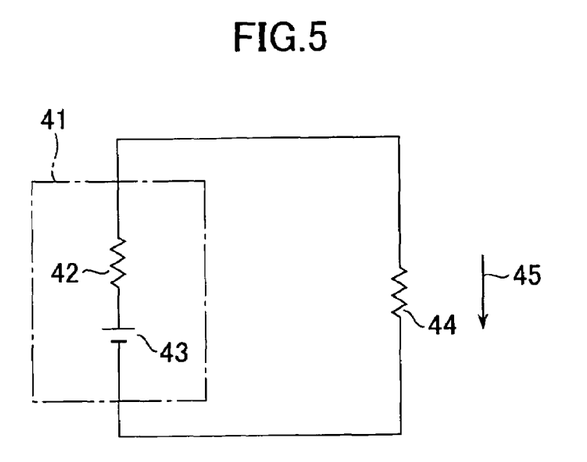
FIG. 5 is a block diagram for illustration on a lithium ion secondary cell applied to the present invention pursuant to an embodiment.

The cell polarization voltage IRV is given as the voltage drop that arises in an internal resistance 42 of a lithium ion secondary cell 41 by allowing a current 45 to flow from a secondary cell 43 at the time when a load 44 is connected, as shown in FIG. 5. Thus, assuming that a detected terminal voltage of the lithium ion secondary cell 41 is Vo, for instance, the terminal voltage Vo may be given by subtracting a cell polarization voltage IRV component from an original cell voltage OCV of the secondary cell 43. Further, the current 45 at the charging time flows in the opposite direction of a current flow at the discharging time, so that the terminal voltage Vo is obtained with the cell polarization voltage IRV component added to the original cell voltage OCV of the secondary cell 43.

Thus, the terminal voltage Vo of each of the lithium ion secondary cells 41 at the discharging time (at the time when the load is connected) is expressed in terms of an expression (1), and that at the charging time is expressed in terms of an expression (2).

$$Vo=OCV-IRV \quad (1)$$

$$Vo=OCV+IRV \quad (2)$$

Herein, the expression (1) and the expression (2) may be given in terms of the following expression (3) by assigning a plus sign to a current value in a discharge direction, and a minus sign to a current value in a charge direction. This enables a single computational expression to be adapted to meet calculations for both of the charging time and the discharging time.

$$Vo=OCV-IRV \quad (3)$$

Further, the following expression (4) is developed from the above expression (3).

$$OCV=Vo+IRV \quad (4)$$

Thus, even if it is judged in Step S2 that the load is connected, the residual capacity rate may be obtained with reference to the cell voltage-to-residual capacity rate table having the non-loaded time discharge curve from the detected terminal voltage Vo by means of addition or subtraction of the cell polarization voltage IRV using the above expression (4), irrespectively of the charging or discharging time.

However, when the cell polarization voltage IRV is calculated, a standard value of a voltage drop component needs to be set as a constant. As described above, this is because the cell polarization voltage IRV undergoes great fluctuations with environmental temperature and deterioration condition etc. Then, a value that may be calculated from a drop voltage (the cell polarization voltage) generated by allowing the current to flow instantaneously in an initial state is specified as a cell Imp standard value, with an ambient temperature assumed to be 25 degrees.

$$\text{Cell Imp standard value}=IRV/I \quad (5)$$

A calculated value obtained using the above expression (5) is a cell standard value in the initial state with a temperature of 25 degrees specified as room temperature. Thus, a temperature characteristic treated as a coefficient is also preset by expressing the room temperature of 25 degrees in terms of a value specified as "1".

Figure 6:
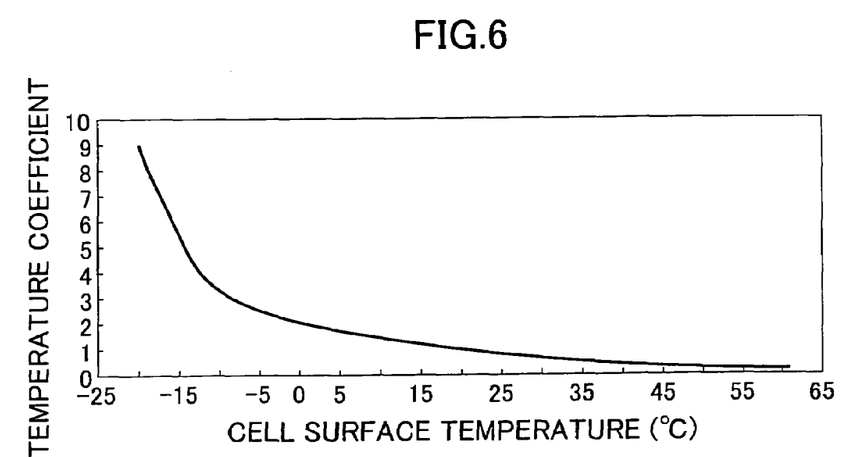
FIG. 6 is a characteristic diagram for illustration on a temperature coefficient applied to the present invention pursuant to an embodiment.

In the above embodiment, a temperature coefficient is calculated from the secondary cell group 19-cell temperature obtained from the thermistor 17 with reference to a temperature coefficient table (See FIG. 6) incorporated in the microcomputer 12. Even in intermediate temperatures, the temperature coefficient is also found by calculating a value obtained by interpolation from a value thereabout. A computational expression of the temperature coefficient may be given in terms of an expression (6) and an expression (7). Herein, a direct current Imp is assumed to be polarization voltage/current, in other words, a voltage drop component (at the discharging time) or a voltage rise component (at the charging time) at the time when flowing of a current of 1(A) occurs.

$$\text{Direct current Imp}=(\text{No-loaded time voltage}-\text{Discharge voltage under each temperature environment})/\text{Current} \quad (6)$$

$$\text{Temperature coefficient}=\text{Direct current Imp}/\text{Direct current Imp at the time of 25 degrees} \quad (7)$$

Figure 7:
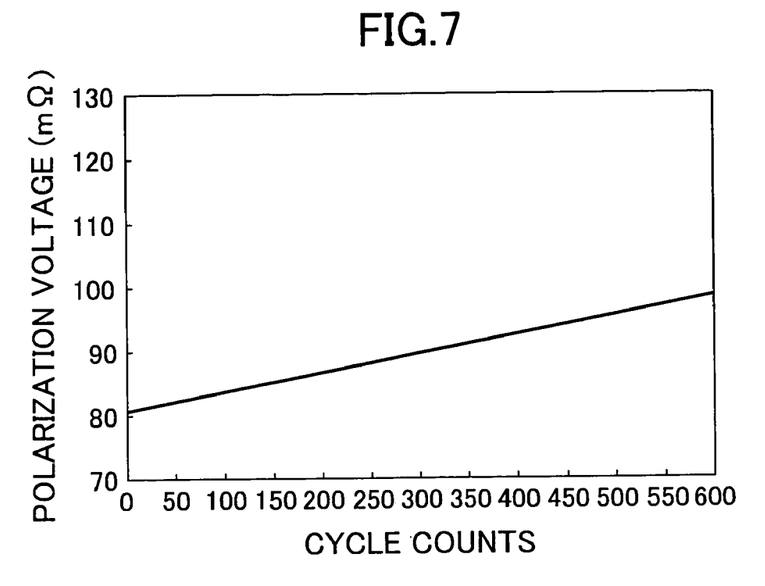
FIG. 7 is a characteristic diagram for illustration on cycle counts applied to the present invention pursuant to an embodiment.

In addition, factors having an effect on the internal resistance also include the deterioration, and as to the deterioration, a coefficient is also calculated using pre-measured data, similarly. However, a deterioration coefficient is provided in a linear shape as shown by an expression (8) and in FIG. 7, unlike the temperature coefficient. Thus, in the above embodiment, the deterioration coefficient is added in increments of prescribed cycles, specifically, 50-cycle increments, for instance, without providing a table for the deterioration coefficient separately. An initial value of the deterioration coefficient is also "1.00".

$$\text{Deterioration coefficient}=\text{Deterioration coefficient}+\text{Constant (Coefficient increment)} \quad (8)$$

As described above, the temperature and deterioration characteristics are expressed in terms of the coefficients on the basis of the prescribed data obtained by pre-evaluation. Next, the control to calculate the residual capacity rate is described below. In Step S2, it is judged that the discharging or the charging is being performed, and the control moves on to Step S4.

In Step S4, the temperature coefficient is calculated using the expression (6) and the expression (7) described above. In Step S5, the cell polarization voltage IRV shown by reference numeral 81 in FIG. 8 is calculated using an expression (9).

$$IRV=\text{Cell Imp standard value (constant)}\times\text{Temperature coefficient}\times\text{Deterioration coefficient}\times\text{Current value} \quad (9)$$

Figure 8:
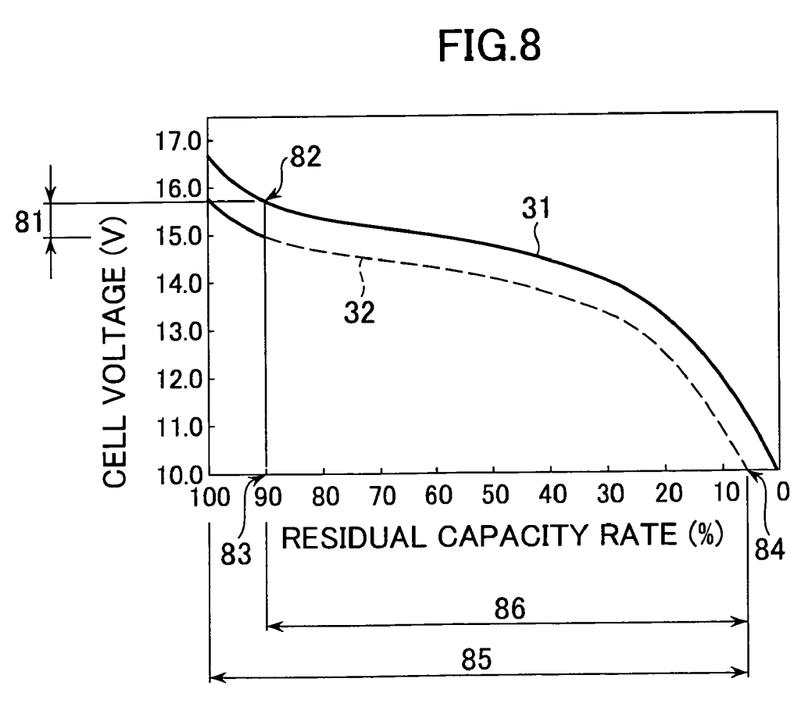
FIG. 8 is a characteristic diagram for illustration on a residual capacity calculation applied to the present invention pursuant to an embodiment.

In Step S6, the original cell voltage (the terminal voltage of the secondary cell 43) OCV shown by reference numeral 82 in FIG. 8 is calculated using the above expression (4) by the use of the detected terminal voltage.

In Step S7, the residual capacity rate shown by reference numeral 83 in FIG. 8 is obtained from the no-loaded time discharge curve 31 with reference to the cell voltage-to-residual capacity rate table from the calculated cell voltage OCV. However, this residual capacity rate is given as a no-loaded time discharge position, in other words, is a temporary residual capacity rate, so that it is necessary to perform a processing to calculate a relative charging rate that is to be obtained in consideration of a loaded condition.

In Step S8, it is judged from the detected current direction whether or not the discharging is being performed. When it is judged that the discharging is being performed, the control moves on to Step S9. Conversely, when it is judged that the charging is being performed, the control moves on to Step S20.

In Step S9, a final discharge prediction point shown by reference numeral 84 in FIG. 8 is calculated. In the case of a lithium ion secondary cell of hard carbon type, for instance, a discharge capacity greatly varies with load condition. Thus, in the above embodiment, the final discharge prediction point is calculated to obtain the whole cell discharge capacity representing how dischargeable the secondary cell is in the present loaded condition, that is, a dischargeable capacity rate. There is used a calculation method in which a final discharging time voltage (the terminal voltage of the secondary cell 43) OCV is calculated by addition of the final discharge voltage to the previously calculated drop voltage IRV as shown by an expression (10) to make the reference to the cell voltage-to-residual capacity rate table using the calculated voltage.

$$\text{Final discharging time voltage OCV} = \text{Final discharge voltage} + \text{IRV} \quad (10)$$

In Step S10, the final discharge prediction point is subtracted from 100% of the no-loaded time cell capacity as shown in an expression (11), and a dischargeable capacity rate shown by reference numeral 85 in FIG. 8 is calculated.

$$\text{Dischargeable capacity rate} = 100\% - \text{Final discharge prediction point} \quad (11)$$

In Step S11, a dischargeable residual capacity rate is calculated from the temporary residual capacity rate and the final discharge prediction point as shown in an expression (12), and a relative residual capacity rate shown by reference numeral 86 in FIG. 8 is calculated by dividing the obtained dischargeable residual capacity rate value by the whole dischargeable capacity rate.

$$\text{Relative residual capacity rate} = (\text{Temporary residual capacity rate} - \text{Final discharge prediction point}) / \text{Dischargeable capacity rate} \quad (12)$$

When the charging is being performed, the relative residual capacity rate is obtained in Step S20 with reference to the no-load connection time discharge curve 31 shown in the cell voltage-to-residual capacity rate table from the cell voltage OCV calculated using the above expression (4). A charging system of the lithium ion secondary cell is of constant-current and constant-voltage charging, so that the calculation (Step S9) of the final discharge prediction point, the calculation (Step S10) of the dischargeable capacity and the calculation (Step S11) of the relative residual capacity are not performed at the charging time, unlike the discharging time. Further, for the charge capacity at the charging time, a reference capacity is assumed to be 100%.

In Step S12, the residual capacity is calculated from the calculated relative residual capacity rate. As shown by an expression (13), the dischargeable capacity being obtainable by multiplying a prescribed reference capacity value by the dischargeable capacity rate obtained from the expression (11) is calculated. Then, as shown by an expression (14), the residual capacity may be calculated by multiplying the previously calculated dischargeable capacity by the relative residual capacity rate obtained from the expression (12).

$$\text{Dischargeable capacity} = \text{Reference capacity value} \times \text{Dischargeable capacity rate}/100 \quad (13)$$

$$\text{Residual capacity} = \text{Dischargeable capacity} \times \text{Relative residual capacity rate}/100 \quad (14)$$

In Step S13, a cumulative discharge rate is calculated to count charging/discharging cycles. As shown by the expression (15), Δ residual capacity rate is calculated from a difference between the relative residual capacity obtained at the time of the previous detection and the calculated relative residual capacity rate obtained at the time of the present detection in such a manner that the relative capacity rate obtained at the time of the previous detection is stored in advance. Then, as shown by the expression (16), the cumulative discharge rate is calculated by integration of the above residual capacity rate.

$$\Delta\text{Residual capacity rate} = \text{Previously measured time relative residual capacity rate} - \text{Present relative residual capacity rate} \quad (15)$$

$$\text{Cumulative discharge rate} = \text{Cumulative discharge rate} + \Delta\text{Residual capacity rate} \quad (16)$$

In Step S14, it is judged whether or not the calculated cumulative discharge rate is not less than 100%. When it is judged that the cumulative discharge rate is not less than 100%, the control moves on to Step S15. Conversely, when it is judged that the cumulative discharge rate is less than 100%, this flowchart is ended. In the following processing, a method of incrementing a cycle count whenever the cumulative discharge rate reaches 100% is adopted, whereby even if the charging in the course of discharging and a shelf condition or the like are involved, cycle counting may be performed correctly to ensure that the original cell deterioration is easily detectable.

In Step S15, the cycle count is incremented. In Step S16, the cumulative discharge rate is reset.

In Step S17, it is judged whether or not the cycle count reaches a multiple of 50. When it is judged that the cycle count reaches the multiple of 50, the control moves on to Step S18. Conversely, when it is judged that the cycle count does not reach the multiple of 50 yet, this flowchart is ended.

In Step S18, the deterioration coefficient obtained by the above expression (8) is added. In Step S19, the reference capacity of the lithium ion secondary cell is subtracted. The control in Steps S18 and S19 is a processing required for the fact that the deterioration of the lithium ion secondary cell has the characteristic of decreasing not only the internal resistance but also the discharge capacity, as described above. Then, the flowchart is ended.

In the above embodiment, the secondary cell group 19 is composed of the plurality of secondary cells connected in series. Alternatively, the secondary cell group 19 may be a plurality of secondary cells connected in parallel or a plurality of secondary cells connected in series and parallel.

In the above embodiment, whenever the cycle count reaches the multiple of 50, incrementing of the deterioration coefficient and subtracting of the reference capacity are performed. Alternatively, the cycle count for incrementing of the deterioration coefficient and subtracting of the reference capacity is not limited to the multiple of 50.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A secondary cell residual capacity calculation method, comprising:
    detecting a temperature of a plurality of secondary cells;
    detecting a current and a terminal voltage of each of the secondary cells;
    digitizing the temperature, the current, and the terminal voltage;
    calculating a cell polarization voltage from the digitized temperature, current and terminal voltage;
    calculating an original cell voltage from both of the calculated cell polarization voltage and the detected terminal voltage;
    calculating a temporary residual capacity rate based on the calculated original cell voltage with reference to a prearranged cell voltage-to-residual capacity reference data table, wherein the prearranged cell voltage-to-residual capacity reference data table may be used regardless of whether the cell is charging or discharging;
    determining whether the secondary cell is charging or discharging; and
    determining a relative residual capacity rate, wherein if the cell is discharging, the relative residual capacity rate is determined by:
        calculating a final discharge prediction point;
        obtaining a whole cell discharge capacity in a loaded condition thereof; and
        calculating the relative residual capacity rate based on the temporary residual capacity rate, the final discharge prediction point and the whole cell discharge capacity,
    wherein the step of determining the relative residual capacity rate involves reference to one data table, and wherein the one data table is the prearranged cell voltage-to-residual capacity reference data table.

2. The method according to claim 1, wherein the calculating of the cell polarization voltage includes treating both of a charging current and a discharging current in a same manner as a load fluctuation.

3. The method according to claim 1, further comprising:
    calculating a cumulative discharge rate by integration of a residual capacity rate from the relative residual capacity rate; and
    incrementing a charge-discharge count value whenever the calculated cumulative discharge rate reaches a predetermined value.

4. The method according to claim 3, further comprising incrementing a deterioration coefficient and subtracting a reference capacity whenever the charge-discharge count value reaches a prefixed value.

5. The method of claim 1, wherein a dischargeable capacity rate is calculated by subtracting the final discharge prediction point from 100% of a no-loaded time cell capacity.

6. A battery pack, comprising:
    a plurality of secondary cells;
    a cell temperature detector capable of detecting a temperature of the plurality of secondary cells;
    a voltage current detector capable of detecting a current and a terminal voltage of each of the plurality of secondary cells; and
    a controller capable of digitizing the temperature, the current and the terminal voltage, calculating a cell polarization voltage from the digitized temperature, current and terminal voltage, calculating an original cell voltage from both of the calculated cell polarization voltage and the detected terminal voltage, calculating a temporary residual capacity rate; based on the calculated original cell voltage with reference to a prearranged cell voltage-to-residual capacity reference data table, wherein the prearranged cell voltage-to-residual capacity reference data table may be used regardless of whether the cell is charging or discharging, determining whether the secondary cell is charging or discharging, and determining a relative residual capacity rate, wherein if the cell is discharging, the relative residual capacity rate is determined by: calculating a final discharge prediction point, obtaining a whole cell discharge capacity in a loaded condition thereof, and calculating the relative residual capacity rate based on the temporary residual capacity rate, the final discharge prediction point and the whole cell discharge capacity, wherein the step of determining the relative residual capacity rate involves reference to one data table, and wherein the one data table is the prearranged cell voltage-to-residual capacity reference data table.

7. The battery pack according to claim 6, wherein the controller treats both of a charging current and a discharging current in a same manner as a load fluctuation.

8. The battery pack according to claim 6, further comprising: means for calculating a cumulative discharge rate by integration of a Δ residual capacity rate from the relative residual capacity rate and for incrementing a charge-discharge count value whenever the calculated cumulative discharge rate reaches a predetermined value.

9. The battery pack according to claim 8, further comprising: means for incrementing a deterioration coefficient, and subtracting a reference capacity whenever the charge-discharge count value reaches a prefixed value.

10. The method of claim 5, wherein a dischargeable residual capacity rate is calculated from the temporary residual capacity rate and the final discharge prediction point, and the relative residual capacity rate is calculated by dividing the dischargeable residual capacity rate by the dischargeable capacity rate.

11. The battery pack according to claim 6, wherein the controller is capable of calculating a dischargeable capacity rate by subtracting the final discharge prediction point from 100% of a no loaded time cell capacity.

12. The battery pack of claim 11, wherein the controller is capable of calculating a dischargeable residual capacity rate from the temporary residual capacity rate and the final discharge prediction point, and calculating the relative residual capacity rate by dividing the dischargeable residual capacity rate by the dischargeable capacity rate.

* * * * *